United States Patent
Ang

(10) Patent No.: US 9,029,978 B2
(45) Date of Patent: May 12, 2015

(54) SEMICONDUCTOR TRENCH STRUCTURE HAVING A SILICON NITRIDE LAYER OVERLAYING AN OXIDE LAYER

(75) Inventor: Ting Cheong Ang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 12 days.

(21) Appl. No.: 13/456,079

(22) Filed: Apr. 25, 2012

(65) Prior Publication Data

US 2012/0211863 A1    Aug. 23, 2012

Related U.S. Application Data

(62) Division of application No. 12/258,366, filed on Oct. 24, 2008, now Pat. No. 8,187,950.

(30) Foreign Application Priority Data

Jul. 8, 2008  (CN) .......................... 2008 1 0040371

(51) Int. Cl.
   *H01L 29/00* (2006.01)
   *H01L 21/762* (2006.01)

(52) U.S. Cl.
   CPC .............................. *H01L 21/76224* (2013.01)

(58) Field of Classification Search
   USPC ............ 438/437, 424; 257/E21.55, 499, 501, 257/510
   See application file for complete search history.

(56) References Cited

U.S. PATENT DOCUMENTS

| | | | | |
|---|---|---|---|---|
| 4,960,727 | A * | 10/1990 | Mattox et al. | 438/437 |
| 5,930,633 | A * | 7/1999 | Liaw | 438/296 |
| 6,507,075 | B1 * | 1/2003 | Lee et al. | 257/368 |
| 7,482,246 | B2 * | 1/2009 | Eun | 438/437 |
| 7,666,742 | B2 | 2/2010 | Kim et al. | |
| 7,709,345 | B2 | 5/2010 | Sandhu et al. | |
| 2002/0155721 | A1 | 10/2002 | Wang et al. | |
| 2007/0148927 | A1 | 6/2007 | Kim | |
| 2009/0057784 | A1 | 3/2009 | Chen | |

OTHER PUBLICATIONS

Final Office Action for U.S. Appl. No. 12/258,366, mailed Oct. 20, 2011, 6 pages.
Non-Final Office Action for U.S. Appl. No. 12/258,366, mailed Jun. 13, 2011, 6 pages.
Notice of Allowance for U.S. Appl. No. 12/258,366, mailed Jan. 26, 2012, 6 pages.
Office Action of Chinese Application No. 200810040371.7, dated Apr. 1, 2010, 5 pages total (English translation not included).
Requirement for Restriction/Election for U.S. Appl. No. 12/258,366, mailed Feb. 4, 2011, 4 pages.

* cited by examiner

*Primary Examiner* — Michael Shingleton
(74) *Attorney, Agent, or Firm* — Kilpatrick Townsend & Stockton LLP

(57) ABSTRACT

A semiconductor structure includes a semiconductor substrate with a substrate region and a trench extending into the surface region of the semiconductor substrate. The trench includes sidewalls, a bottom and a depth. The semiconductor structure further includes a trench liner overlying the bottom and the sidewalls of the trench. The semiconductor structure also includes a shallow trench isolation structure filling at least the depth of the trench. The shallow trench isolation structure is formed from alternating layers of silicon nitride and high-density plasma oxide.

15 Claims, 19 Drawing Sheets

SEMICONDUCTOR TRENCH STRUCTURE HAVING A SILICON NITRIDE LAYER OVERLAYING AN OXIDE LAYER

CROSS-REFERENCE TO RELATED APPLICATIONS

The present application is a divisional application of U.S. application Ser. No. 12/258,366, filed Oct. 24, 2008, the entire content of which is incorporated herein by reference for all purposes. The U.S. application Ser. No. 12/258,366 claims priority to Chinese Patent Application No. 200810040371.7, filed Jul. 8, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method of semiconductor device formation with reduced void formation and a resulting structure. Merely by way of example, the invention has been applied to the formation of shallow trench isolation (STI) regions. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. Additionally, as devices require faster and faster designs, process limitations exist with conventional processes and materials.

One such example of a process limitation deals with the difficulty of controlling etch selectivity within an ONO spacer etch process. For example, micro-trenches can occur as a result of overetching of the STI region during the formation of ONO spacers. Micro-trenches can lead to voids and tunnels forming, which can cause moisture or chemicals to be trapped during subsequent processing steps. This can result in lowered electrical reliability and an increase in the amount of short circuits within the completed circuit.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method of semiconductor device formation with reduced void formation and a resulting structure. Merely by way of example, the invention has been applied to the formation of shallow trench isolation (STI) regions. But it would be recognized that the invention has a much broader range of applicability.

In a specific embodiment of the present invention, a method of forming a semiconductor structure is provided. The method includes providing a semiconductor substrate with a substrate region. The method also includes forming a pad oxide layer overlying the substrate region. The method additionally includes forming a stop layer overlying the pad oxide layer. Furthermore, the method includes patterning the stop layer and the pad oxide layer to expose a portion of the substrate region. In addition, the method includes forming a trench within an exposed portion of the substrate region, the trench having sidewalls and a bottom and a height. Also, the method includes depositing an oxide layer to a first height within the trench using an HDP-CVD process. The method additionally includes depositing a silicon nitride layer within the trench. The silicon nitride layer overlies the oxide layer and at least fills the trench. The method also includes performing a planarization process to remove a portion of the silicon nitride and oxide layers. Furthermore, the method includes removing the pad oxide and stop layers.

In another embodiment of the invention, a method of forming a semiconductor structure is provided. The method includes providing a semiconductor substrate with a substrate region. The method also includes forming a pad oxide layer overlying the substrate region. The method additionally includes forming a stop layer overlying the pad oxide layer. Furthermore, the method includes patterning the stop layer and the pad oxide layer to expose a portion of the substrate region. In addition, the method includes forming a trench within an exposed portion of the substrate region, the trench having sidewalls and a bottom and a height. Also, the method includes depositing alternating layers of silicon nitride and oxide to at least fill the trench with the oxide layers deposited by an HDP-CVD process. The method additionally includes performing a planarization process to remove a portion of the silicon nitride and oxide layers. In addition, the method includes removing the pad oxide and stop layers.

In another embodiment of the invention, a semiconductor structure is provided. The structure includes a semiconductor substrate with a surface region and a trench extending into the surface region. The trench has sidewalls, a bottom, and a depth. The semiconductor structure also includes a shallow trench isolation structure filling at least the depth of the trench and extending above the trench. The shallow trench isolation region is formed from alternating layers of silicon nitride and HDP oxide.

Many benefits are achieved by way of the present invention over conventional techniques. For example, the present technique provides an easy to use process that relies upon conventional technology. In some embodiments, an effective gapfill process is provided which reduces voiding within the deposited gapfill layer. For example, the amount of voiding occurring as a result of micro-trenching is greatly reduced. This can improve the device reliability and performance of the semiconductor circuit being formed by providing superior electrical isolation. In addition, lower leakage current and a tighter electrical distribution can also result. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method of semiconductor device formation with reduced void formation and a resulting structure. Merely by way of example, the invention has been applied to the formation of shallow trench isolation (STI) regions. But it would be recognized that the invention has a much broader range of applicability.

Figure 1:
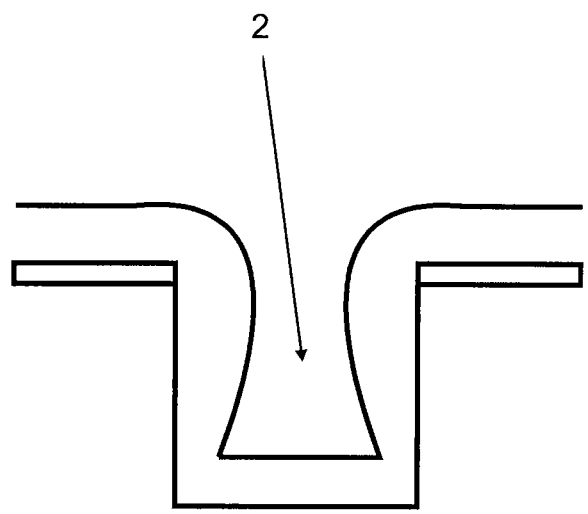
FIG. 1 is a simplified drawing showing void formation following a conventional deposition process.
Figure 2:
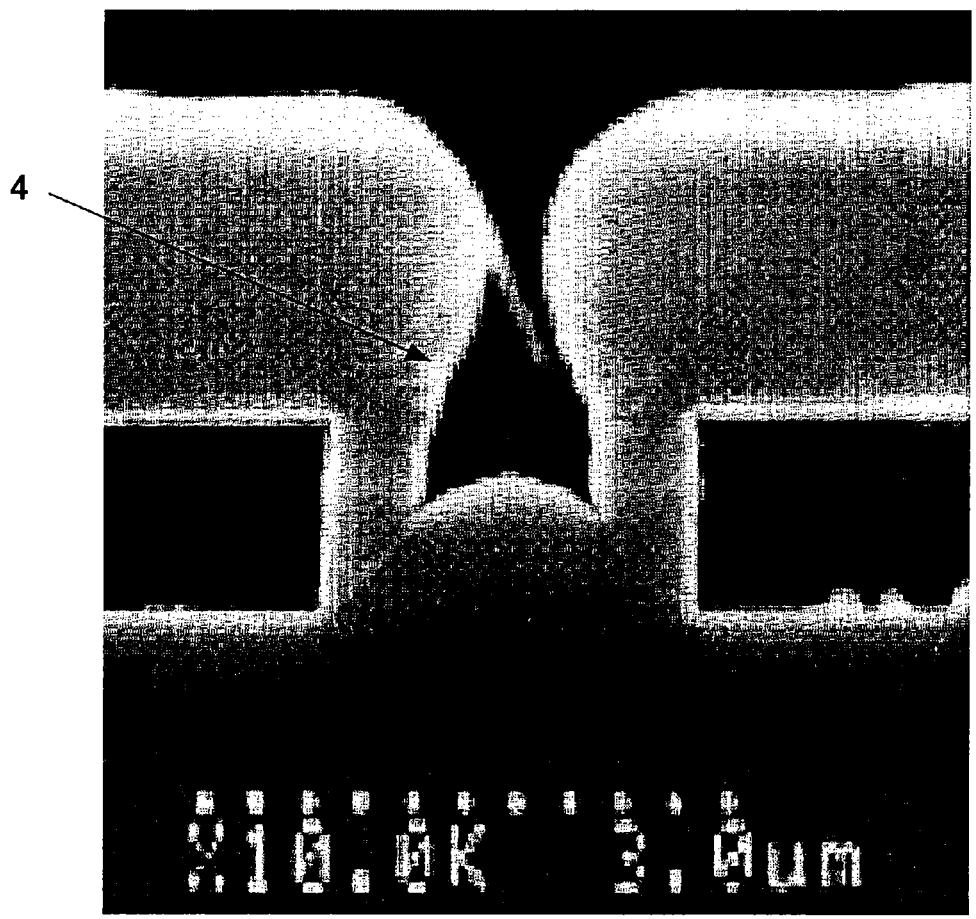
FIG. 2 is a SEM image of void formation in a conventional STI process.

FIG. 1 is a simplified drawing showing void formation in a conventional trench filling process and FIG. 2 is a SEM image of void formation in a conventional STI process. A deposition process is used to fill the high aspect ratio trenches formed within the substrate. For example, a high aspect ratio trench is a trench where the ratio of the trench depth to the trench width is greater than 5:1. A trench with exemplary dimensions of a trench opening of 12 microns and a depth of 5000 Å can incur a number of problems when performing a deposition process. One major problem that can occur is that overhang of the deposited material on the top corners of the trench can cause voids to form in the deposited material. For example, the inventor has discovered that this occurs because a larger amount of the deposited material collects on the corners of the trench instead of being evenly distributed throughout the trench. As material collects on the corners of the trench, it encroaches into the trench opening and causes more and more material to be deposited on the trench corners. More specifically, the trench aperture may have a reentrant angle whereby the upper width of the aperture is smaller than the bottom width of the trench. This causes void 2 to form within the central portion of the trench, which can result in increased resistance in the deposited film, reliability problems of integrated circuits being formed by the structure of FIG. 1, and ultimately device failure that results in lowered yield rates of the process by which the integrated circuits are manufactured.

FIG. 2 is an SEM image showing void formation in a conventional STI process. An STI process is commonly used during wafer processing to electrically isolate adjacent transistors formed on a common semiconductor substrate. A single trench etch step is commonly used in the formation of the trenches. This results in the trenches having a conventional or 'steep' profile as a result of the trench formation process. For example, the sidewalls of the trench may have a slight continuous taper which results in the bottom of the trench being slightly narrower than the trench opening. After the gapfill or deposition process has been performed, void 4 can occur as a result of overdeposition of the gapfill layer.

Figure 3:
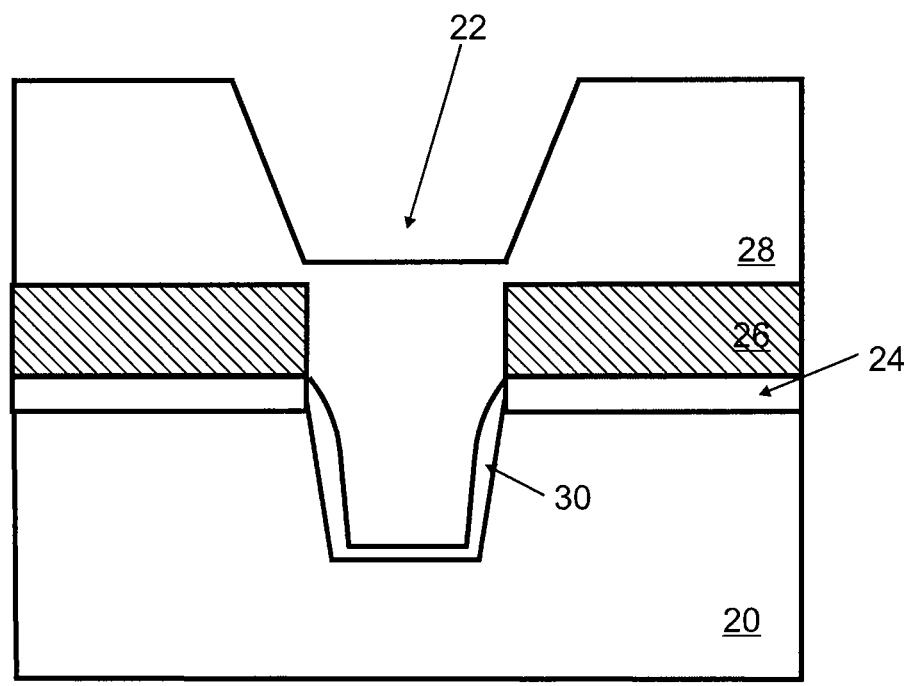
FIG. 3 is a drawing showing different layers within a conventional STI process.

FIG. 3 is a drawing showing different layers within a conventional STI process. For example, a semiconductor substrate 20 is provided, and a pad oxide layer 24 and a nitride layer 26 are provided. The nitride layer 26 may be used as a stop layer for subsequent trench etch or planarization processes, and the pad oxide layer 24 may be used as an intermediate layer between the silicon substrate 20 and the silicon nitride layer 26 that is deposited on top of the oxide layer 24. A trench 22 is formed using photolithography and etch processes which extends a certain depth into the silicon substrate 20. Following the trench etch process, a liner oxide may be grown on the trench sidewalls and bottom. An HDP-CVD process is then used to fill the trench 22 with HDP oxide 28 to form an isolation region. The HDP oxide 28 may additionally be deposited over the mesa regions adjacent to the trench 22.

In a subsequent process, the excess HDP oxide 28 on the mesa regions is removed using a planarization process using the nitride layer 26 as a stop layer. The nitride layer 26 and pad oxide layer 24 are then removed using an etch or oxide strip process. The remaining STI region may be further planarized in a subsequent process so that a top surface of the remaining STI region is approximately even with the silicon substrate 20. A gate oxide and polysilicon region can be formed on the silicon areas adjacent to the STI region in accordance with conventional processes. An ONO layer is then deposited over the gate oxide and silicon region, and patterned to form ONO spacers. However, during the spacer etch process, micro-trenches can form on the STI region. The etchants used within the spacer etch process can interact with the HDP oxide layer 28 in the STI region, resulting in void formation and reliability problems.

Figure 4:
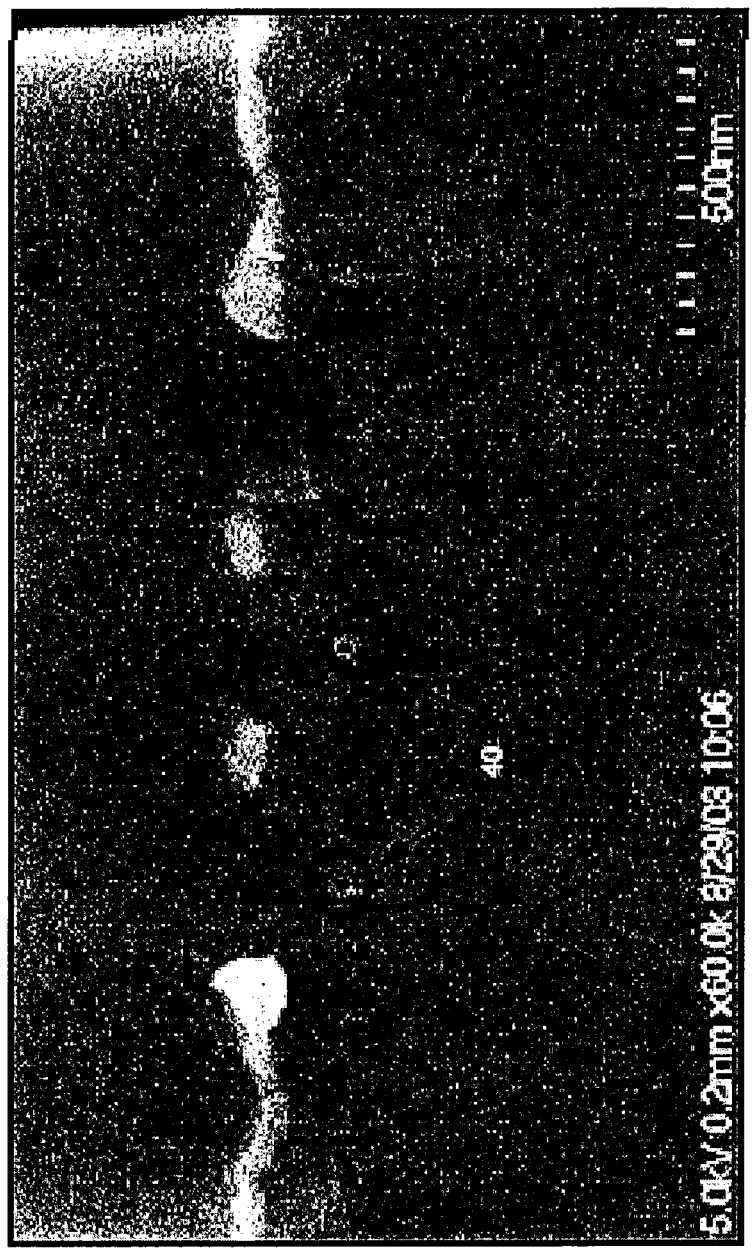
FIGS. 4-6 are SEM images showing void formation caused by micro-trenches in a conventional STI process within an A-A plane.
Figure 5:
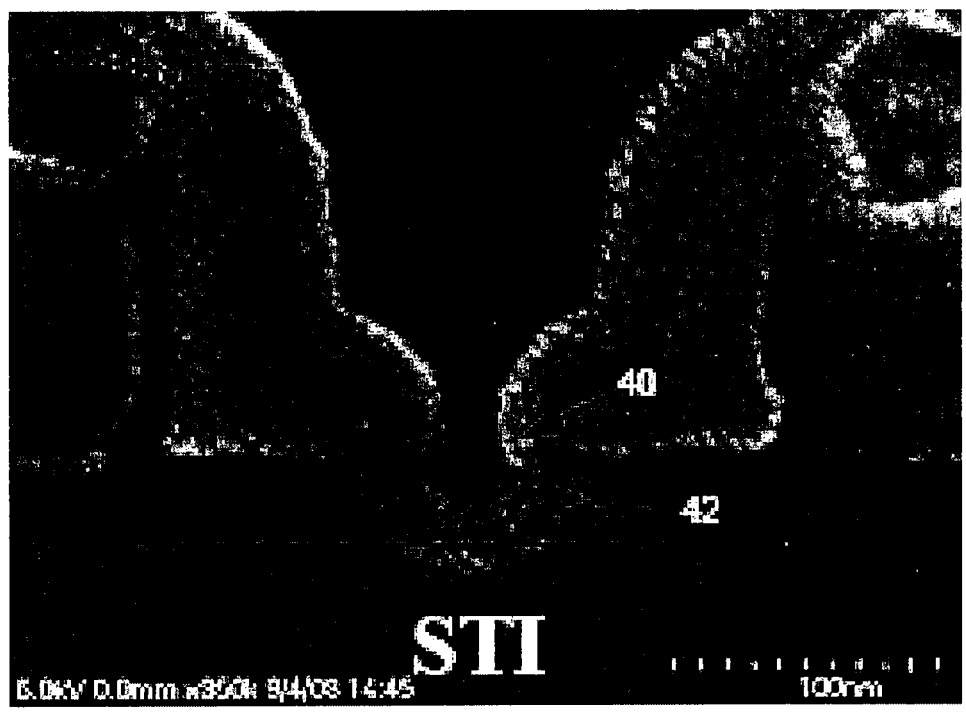
Figure 6:
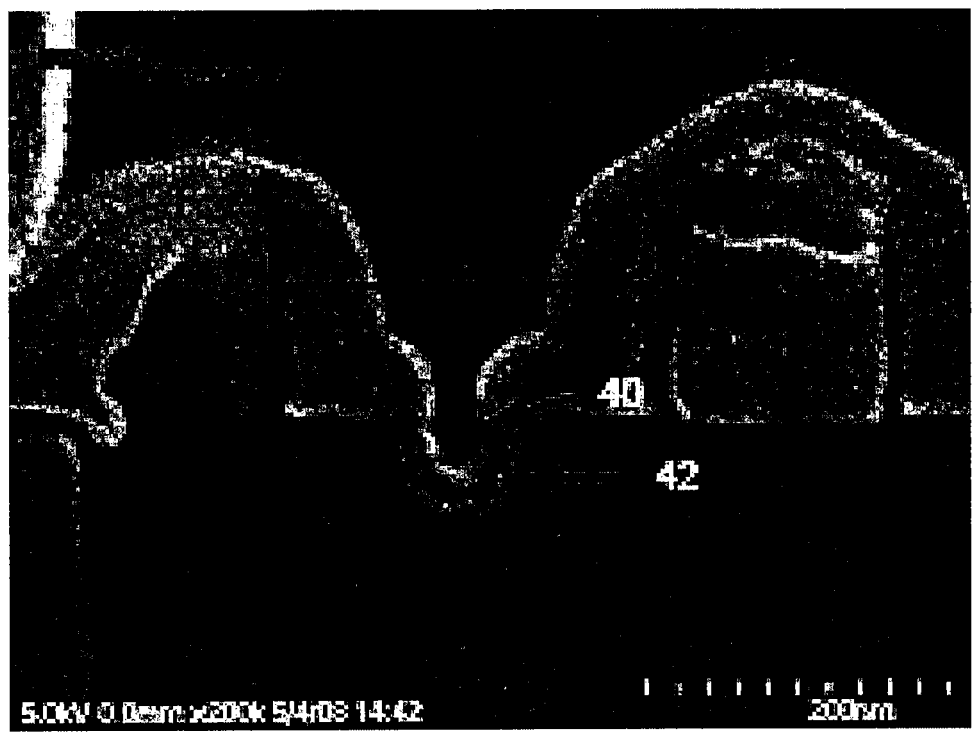

FIGS. 4-6 are SEM images showing void formation caused by micro-trenches in a conventional STI process within an A-A plane. For example, within FIG. 4, several voids 40 can be seen within the semiconductor substrate. FIGS. 5-6 illustrate the voids 40 within the semiconductor substrate in greater detail. Micro-trenches 42 can also be seen below the voids. Due to the difficulty in filling the small dimensions of the micro-trenches 42, the voids 40 may occur during subsequent processing steps, such as during pre-metal dielectric (PMD) deposition. For example, the micro-trenches may have an opening of 20 nm. Increased shorts and leakage current can result due to voiding, reducing the reliability of circuits formed using conventional processes.

Figure 7:
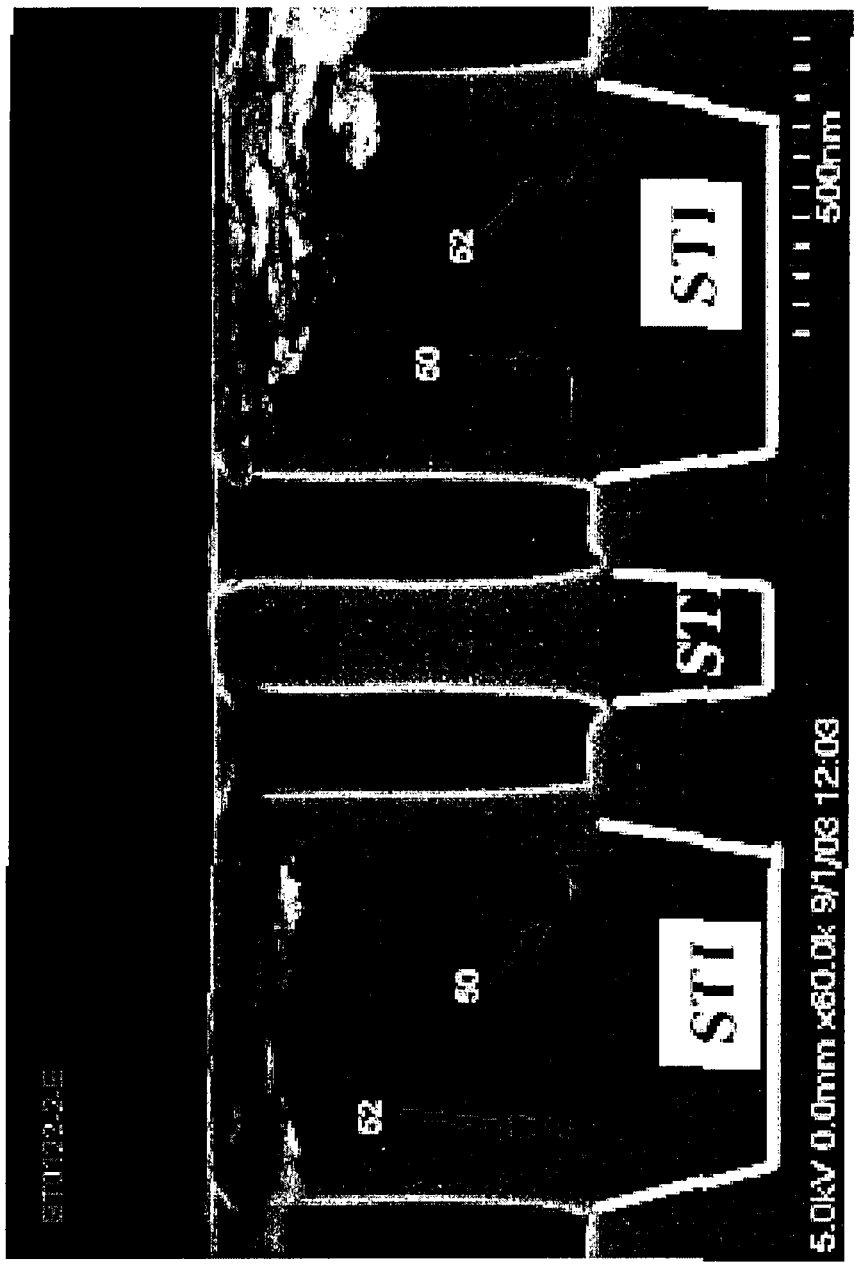
FIG. 7 is an SEM image showing void and tunnel formation caused by micro-trenches in a conventional STI process within a B-B plane.

FIG. 7 is an SEM image showing void and tunnel formation caused by micro-trenches in a conventional STI process within a B-B plane. In a top view of the semiconductor substrate, the B-B plane is perpendicular to the A-A plane shown in FIGS. 4-6. Voids 50 can also be seen within the B-B plane of the substrate. In a worst-case scenario, tunnels 52 can also be formed within the silicon area, leading to moisture and chemicals being trapped during subsequent process steps, such as a post-contact etch wet clean.

FIGS. 8-15 are simplified exemplary drawings showing cross-sections of a semiconductor substrate during an STI process according to an embodiment of the present invention. For example, FIGS. 8-15 may be viewed in conjunction with FIG. 16, which is a simplified exemplary process flow of an STI process according to an embodiment of the present invention. These diagrams are merely examples, which should not unduly limit the scope of the claims herein. One of ordinary skill in the art would recognize many variations, modifications, and alternatives. Process flow 100 includes process 102 for providing a semiconductor substrate, process 104 for forming a pad oxide and silicon nitride layers upon the substrate, process 106 for performing photolithography and trench etch processes to form a trench within the substrate, process 108 for forming a trench liner within the trench, process 110 for depositing a high-density plasma (HDP) oxide layer to a partial height within the trench, process 112 for filling the remainder of the trench with a silicon nitride film, process 114 for performing a planarization process to remove a portion of the deposited layers, process 116 for removing the silicon nitride and/or pad oxide layers using an etch process, process 118 for forming a gate oxide and polysilicon gate, process 120 for forming source and drain regions, process 122 for depositing an oxide-nitride-oxide (ONO) layer, and process 124 for patterning the ONO layer to form ONO spacers. Although the above has been shown using processes 102-122, there can be many alternatives, modifications, and variations. For example, some of the processes may be expanded and/or combined. Other processes may be inserted to those noted above.

Figure 8:
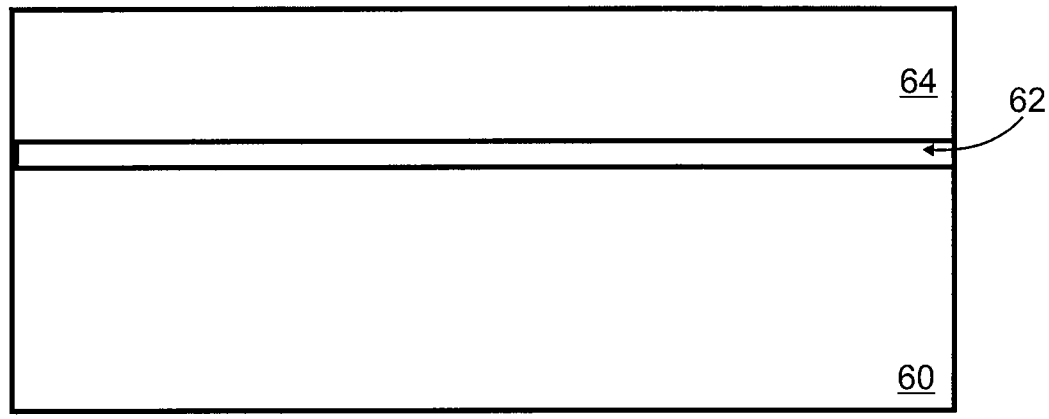
FIGS. 8-15 are simplified exemplary drawings showing cross-sections of a semiconductor substrate during an STI process according to an embodiment of the present invention.

In process 102, a semiconductor substrate 60 is provided. For example, the semiconductor substrate 60 may comprise high purity silicon suitable for transistor formation. In process 104, pad oxide layer 62 and silicon nitride layer 64 are formed upon the substrate according to conventional methods. The pad oxide layer 62 may optionally be omitted. Other materials may be substituted for the silicon nitride layer that are suitable as etch stop layers. In a specific embodiment, the thickness of the pad oxide layer 62 may be 100-1000 Å, and the thickness of the nitride layer may be between 500-3000 Å. The result of these processes is shown in FIG. 8.

Figure 9:
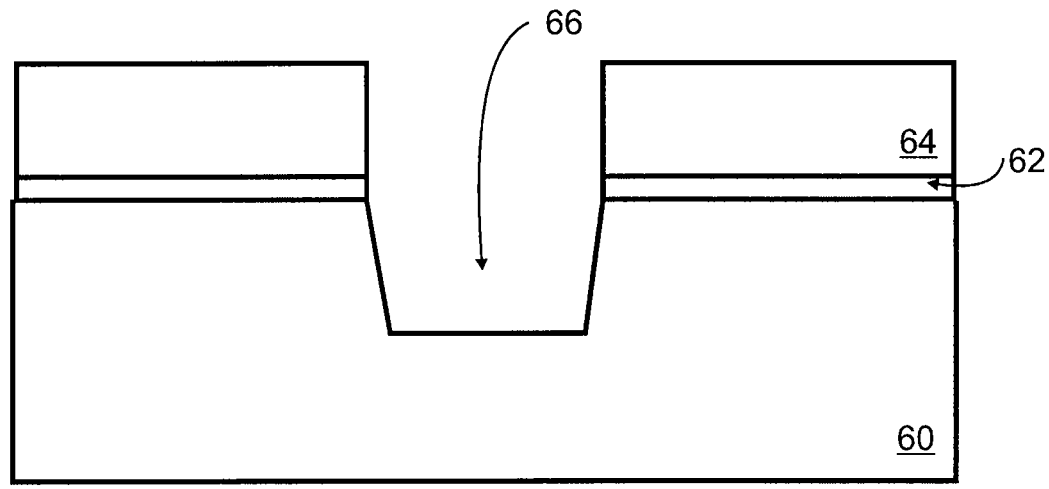
Figure 10:
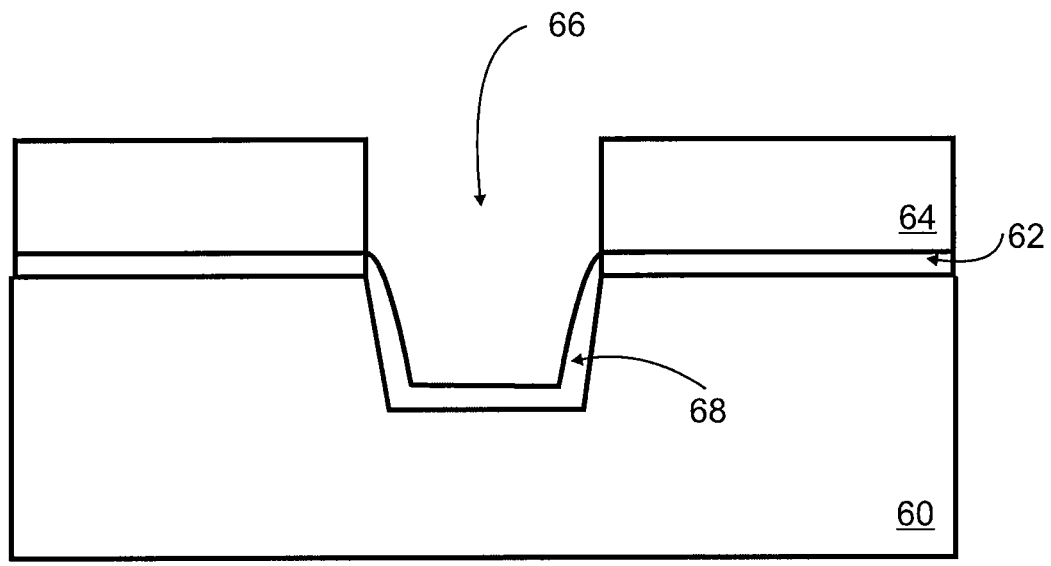
Figure 11:
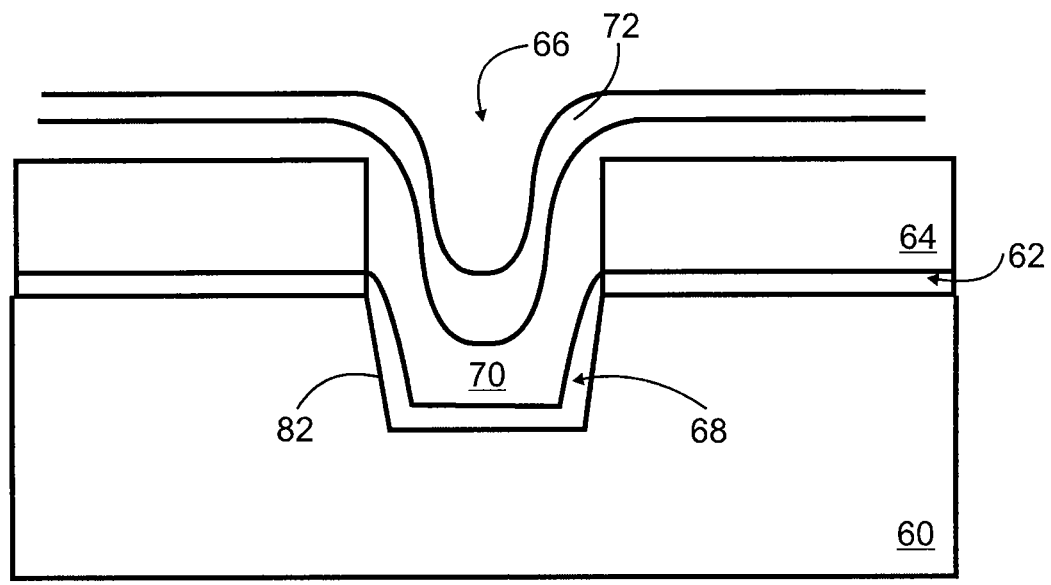

In process 106, a photolithography and trench etch process is used to form a trench within the substrate. A photoresist layer (not shown) may be formed and patterned to expose a portion of the pad oxide layer 62 and the silicon nitride layer 64 for removal. After removal of a portion of the pad oxide layer 62 and the silicon nitride layer 64, a trench 66 may be etched into the silicon substrate 60. For example, the depth of the trench may extend between 3000-10,000 Å into the semiconductor substrate. The result of process 106 is shown in FIG. 9.

In process 108, a trench liner 68 is formed within the trench 66. The trench liner 68 may line the sidewalls and bottom of the trench 66. For example, the trench liner may be a silicon oxide grown using a thermal oxidation process or be a silicon oxynitride layer. The silicon nitride layer 64 on the mesa regions adjacent to the trench 66 prevent oxidation from occurring in areas other than within the trench 66. The result of process 108 can be seen in FIG. 10.

In process 110, a high-density plasma (HDP) oxide layer 70 is deposited to a partial height within the trench 66. For example, the HDP oxide layer 70 may be 65-80% of the total trench height and may also extend over the silicon nitride layer 64 on the mesa regions adjacent to the trench 66. The thickness of the oxide layer may be between 1000-5000 Å, depending on the depth of the trench. In process 112, the remainder of the trench 66 is filled with a silicon nitride layer 72. For example, the thickness of silicon nitride layer 72 may equal or greater than 1200 Å. By using the silicon nitride layer 72 as the top layer of the STI structure 82, the etch selectivity of the STI structure 82 is improved to prevent micro-trenches during subsequent processing steps. The result of these processes can be seen in FIG. 11.

Figure 12:
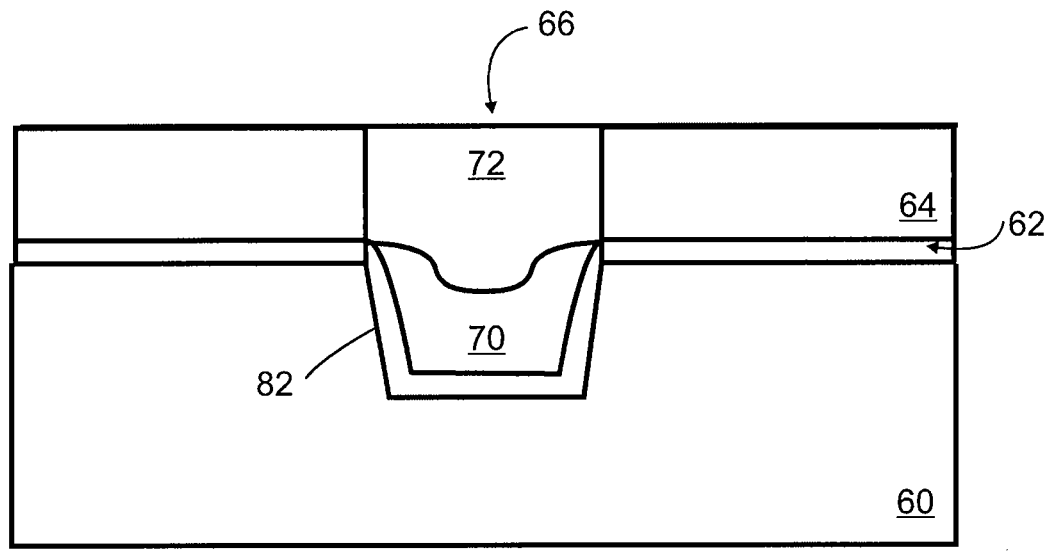
Figure 13:
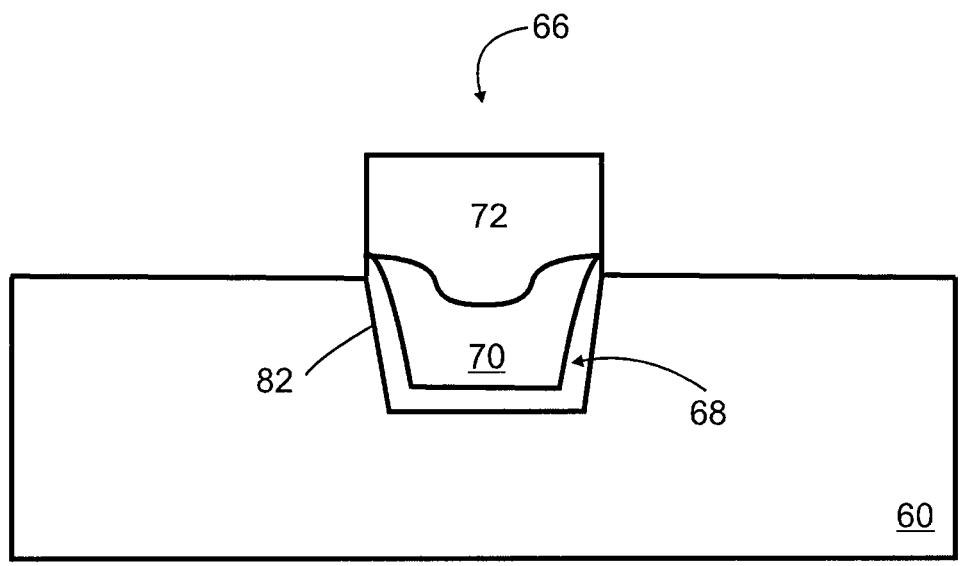

In process 114, a planarization process is performed to remove a portion of the deposited layer. For example, the silicon nitride layer 64 may serve as a stop layer to determine the end point of the planarization process 110. The portions of silicon nitride layer 72 and HDP oxide layer 70 above the top surface of silicon nitride layer 64 are removed by the planarization process. A chemical-mechanical planarization process may be used as the planarization process. The result of this process is shown in FIG. 12. In process 116, the silicon nitride layer 64 and pad oxide layer 62 are removed using etch or oxide/nitride strip processes. This leaves the trench 66 filled with the oxide layer 70 at the bottom of the trench and silicon nitride layer 72 overlying the oxide layer 70. The oxide layer 70 and silicon nitride layer 72 within the trench 66 comprise the STI structure 82 used to electrically separate adjacent transistors. The result of these processes is shown in FIG. 13. Additionally, the STI structure may be further planarized using an etch removal process.

Figure 14:
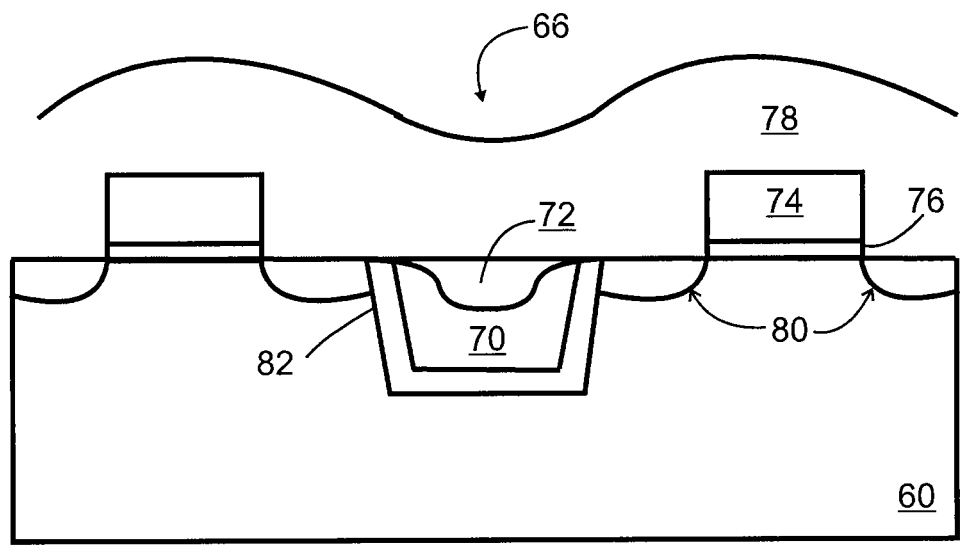

In process 118, a gate oxide layer 76 and polysilicon gate 74 are formed on the mesa regions adjacent to the trench 66. In process 120, source and drain regions 80 are formed within the semiconductor substrate 60 adjacent to the polysilicon gate 74. Source and drain regions 80 may be formed using an ion implantation and subsequent diffusion process, according to conventional methods. However, source and drain implantation may also be performed at different times within the overall process flow. Following the implantation process, an ONO layer 78 is deposited in process 122. The ONO layer 78 overlies the polysilicon gate 74, source and drain regions 80, and also the STI structure 82. The result of these processes is shown in FIG. 14.

Figure 15:
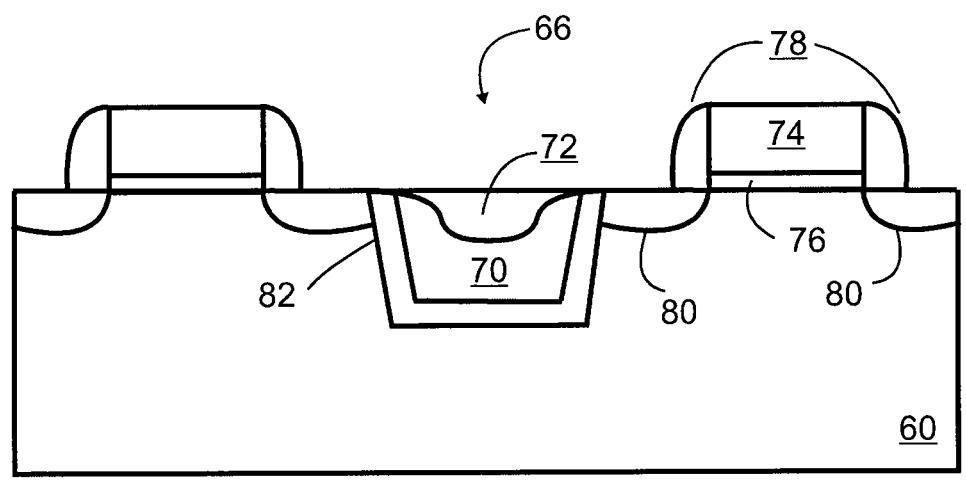

The ONO layer 78 is patterned within process 124 to form ONO spacers 78 in process 124. ONO spacers 78 allow for enhanced electrical isolation within the active area of the device. In a conventional spacer etch process, micro-trenches may form as a result of the interaction of the etchant material with the HDP oxide on the STI region. However, as nitride layer 72 is present at the top surface of STI structure 82, micro-trenching may be avoided. For example, the ratio of the silicon nitride layer 72 to the HDP oxide layer 70 may be selected so that the entire top surface of the STI structure 82 is made from silicon nitride to improve the etch selectivity. The elimination of micro-trenching results in no voids forming during subsequent processing steps. Without having voids present within the semiconductor structure, problems with moisture or chemicals being trapped during post-contact etch clean and electrical problems relating to the voiding can be greatly reduced. The result of these processes is shown in FIG. 15. Of course, there can be other variations, modifications, and alternatives.

Figure 24:
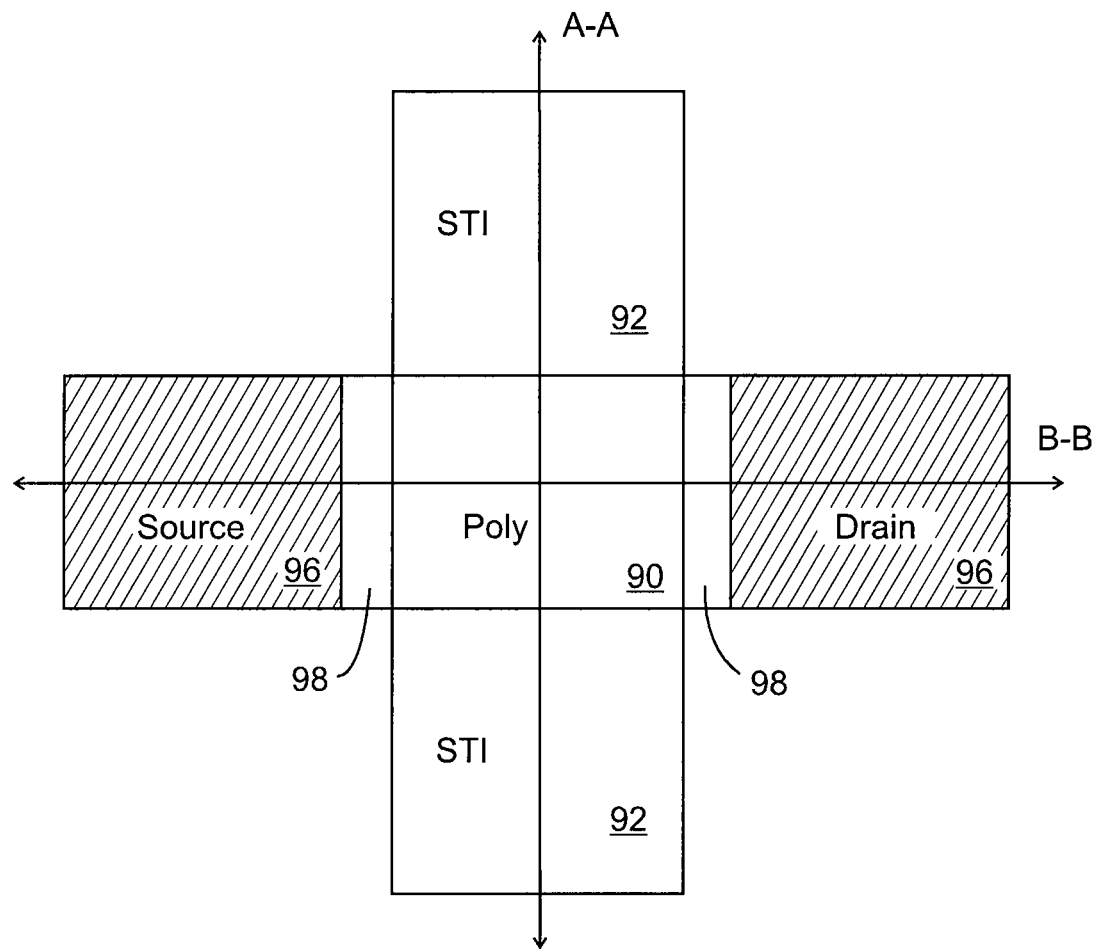
FIG. 24 is an exemplary simplified top-down perspective view of a semiconductor structure according to an embodiment of the present invention.

In an alternative embodiment of the present invention, the source and drain regions 80 may be formed in a different plane than the STI regions, as shown in FIG. 24. FIG. 24 is an exemplary simplified top-down perspective view of a semiconductor structure according to an embodiment of the present invention. In FIG. 24, poly region 90 is within the same A-A plane as STI regions 92. However, ONO spacers 98 and source/drain regions 96 are in a different B-B plane than STI regions 92.

Figure 17:
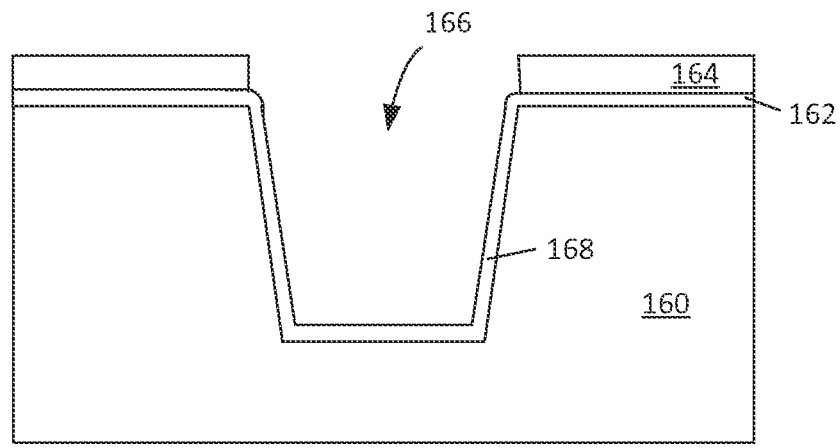
FIGS. 17-19 are simplified exemplary drawings showing cross-sections of a semiconductor substrate during an STI process according to an embodiment of the present invention.
Figure 18:
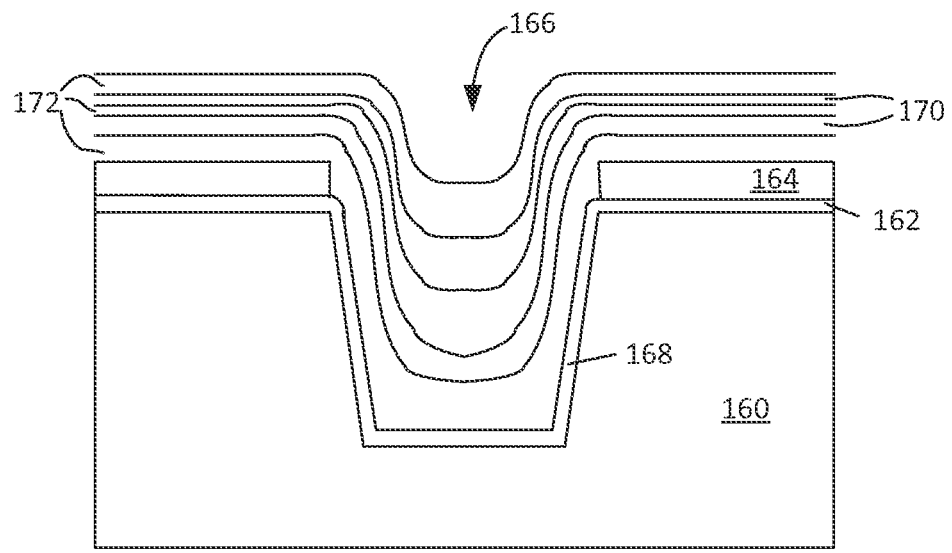
Figure 19:
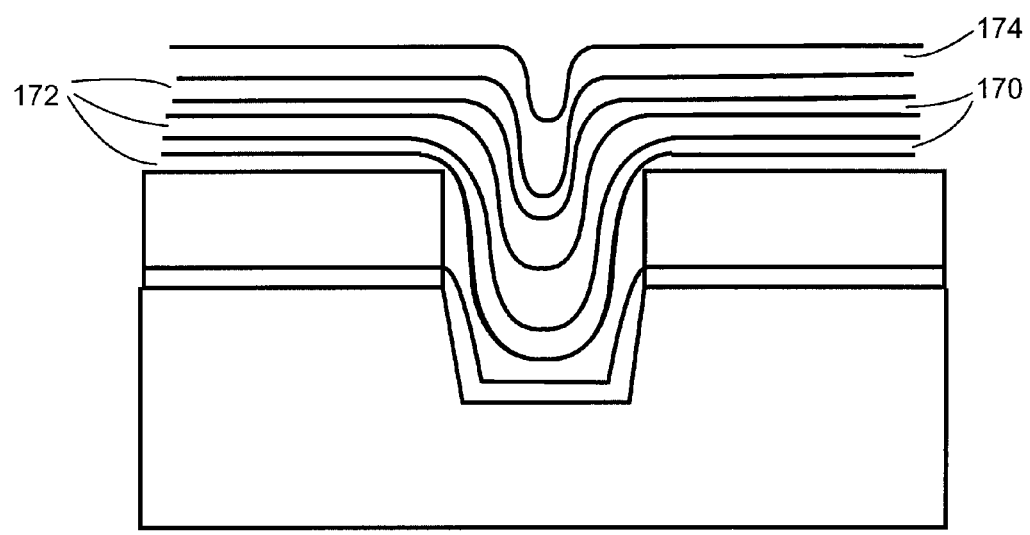
Figure 20:
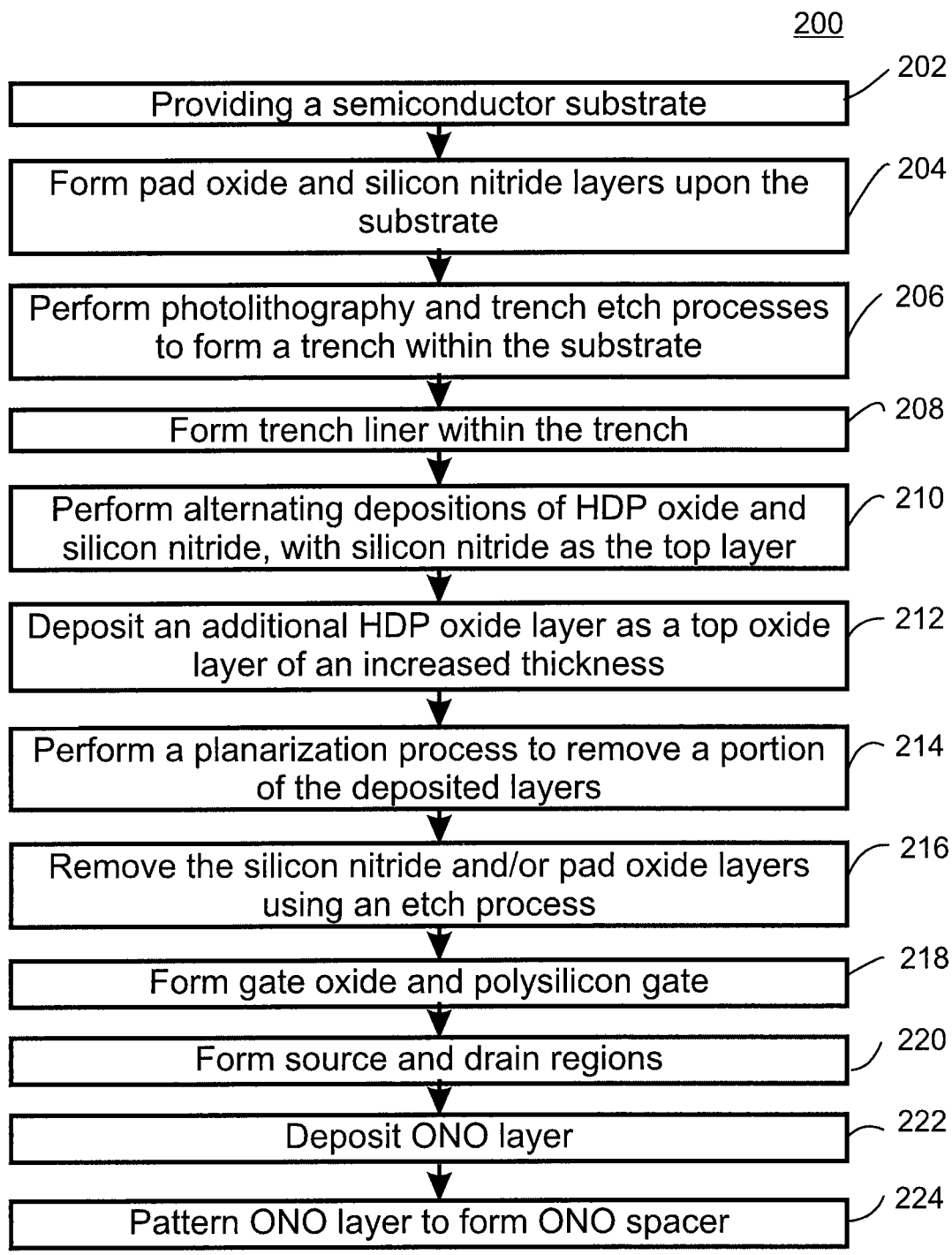
FIG. 20 is a simplified exemplary process flow of an STI process according to an embodiment of the present invention.

FIGS. 17-19 are simplified exemplary drawings showing cross-sections of a semiconductor substrate during an STI process according to an embodiment of the present invention. For example, FIGS. 17-19 may be viewed in conjunction with FIG. 20, which is a simplified exemplary process flow of an STI process according to an embodiment of the present invention. These diagrams are merely examples, which should not unduly limit the scope of the claims herein. One of ordinary skill in the art would recognize many variations, modifications, and alternatives. Process flow 200 includes process 202 for providing a semiconductor substrate, process 204 for forming a pad oxide and silicon nitride layers upon the substrate, process 206 for performing photolithography and trench etch processes to form a trench within the substrate, process 208 for forming a trench liner within the trench, process 210 performing alternating depositions of HDP oxide and silicon nitride with silicon nitride as the top layer, process 212 for depositing an additional HDP oxide layer as a top oxide layer of an increased thickness, process 214 for performing a planarization process to remove a portion of the deposited layers, process 216 for removing the silicon nitride and/or pad oxide layers using an etch process, process 218 for forming a gate oxide and polysilicon gate, process 220 for forming source and drain regions, process 222 for depositing an ONO layer, and process 224 for patterning the ONO layer to form ONO spacers. Although the above has been shown using processes 202-224, there can be many alternatives, modifications, and variations. For example, some of the processes may be expanded and/or combined. Other processes may be inserted to those noted above.

Figure 16:
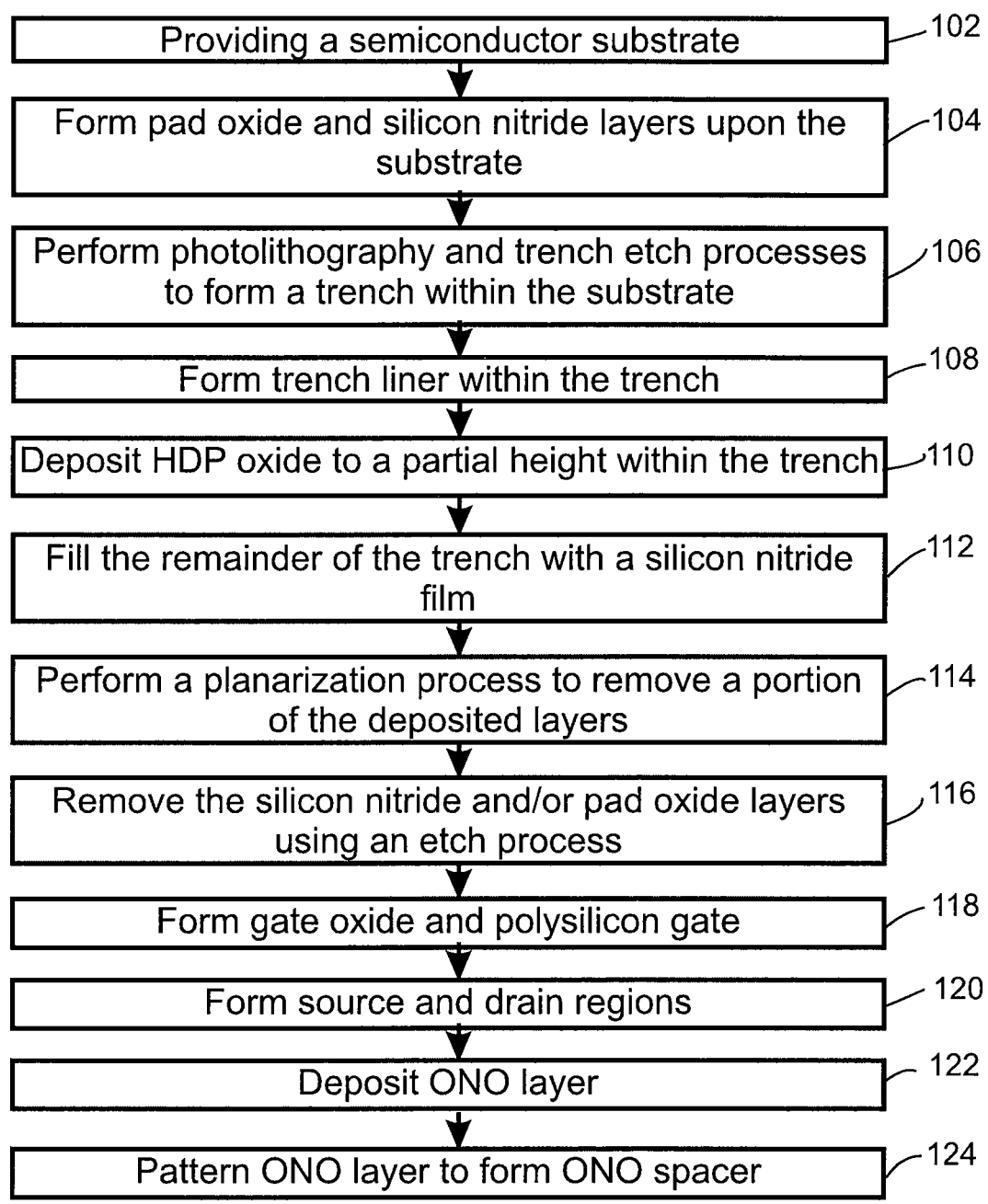
FIG. 16 is a simplified exemplary process flow of an STI process according to an embodiment of the present invention.

Processes 202-208 are similar to corresponding processes performed in regards to FIG. 16 and results in a trench 166 formed into the semiconductor substrate 160. The pad oxide layer 162 and the silicon nitride layer 164 overly mesa regions adjacent to the trench 166. In addition, a trench liner 168 may be formed to line sidewalls and the bottom of the trench 166. These structures can be seen in FIG. 17. In process 210, alternating depositions of silicon nitride 172 and HDP oxide 170 may be performed to fill the trench 166, with a layer of silicon nitride 172 as the top layer. In addition, a silicon nitride layer 172 may be used as the bottom layer overlying liner oxide 168 and silicon substrate 160 to prevent oxidation of the underlying substrate during the subsequent deposition of the HDP oxide layers 170. For example, the thickness of the base layer of silicon nitride can be between 50-1000 Å, while the thickness of subsequent HDP oxide layers can be between 200-3000 Å and the thickness of other silicon nitride layers can be between 50-2000 Å. For example, the alternating layers of silicon nitride 172 and HDP oxide 170 are deposited to sufficiently fill the trench 166. The mesa regions adjacent to the trench 166 may also be covered by the alternating layers of HDP oxide 170 and silicon nitride 172. Silicon nitride is employed as the top layer to improve the etch selectivity during the ONO spacer etch, as a micro-trenches may form in a topmost thin HDP oxide layer due to the ONO spacer etch. The result of these processes is shown in FIG. 18. Of course, there can be other variations, modifications, and alternatives.

One additional benefit provided by depositing alternating layers of layers of silicon nitride 172 and HDP oxide 170 to fill the trench 166 is that the deposition of the alternating layers can be used to tune and control the stress of the STI region. Oxide layers typically possess a compressive film stress from −150 to −300 MPa, while silicon nitride layers typically possess a tensile stress between 200 MPa to 2000 MPa. By controlling the thicknesses of the layers and process conditions used within the deposition, it is possible to tune the STI layer to have an overall tensile stress to create a tensile stress within the silicon channel for improved device performance. Of course, it may also be possible to control the processes used within the deposition to allow the STI process to have an overall compressive stress if needed. Of course, there can be other variations, modifications, and alternatives.

In optional process 212, an additional HDP oxide layer 174 may be deposited overlying the alternating layers of HDP oxide 170 and silicon nitride 172 formed in process 210. This oxide layer 174 may have a greater thickness between 500-1500 Angstroms to reduce problems with delamination or overgrinding that can occur in later processes. The additional HDP layer can be used as a pad oxide layer for a subsequent CMP process. This pad oxide layer 174 may be completely removed following the CMP process, and is not present during the spacer etch process. For example, the oxide layer 174 may extend into the trench below the height of pad oxide layer 162, so that at least a portion of the pad oxide layer 174 remains following subsequent planarization and etch processes. The total stack height of alternating layers of HDP oxide 170 and silicon nitride 172 may differ if additional HDP oxide layer 174 is used. Of course, there can be other variations, modifications, and alternatives.

Processes 214-222 are similar to corresponding processes performed in regards to FIG. 16. However, a STI structure comprising alternating layers of HDP oxide and silicon nitride is formed, instead of the dual-layer STI structure shown in FIGS. 8-15. The use of the alternating layers of HDP oxide and silicon nitride within the STI structure also serves to reduce micro-trenching and voiding from the spacer etch process step. This reduces any complications related to moisture or chemicals being trapped during a post-contact etch clean. In addition, the inclusion of an additional pad oxide layer 174 can serve to reduce problems with delamination or overgrinding that occur with a CMP process. Of course, there can be other variations, modifications, and alternatives.

Figure 21:
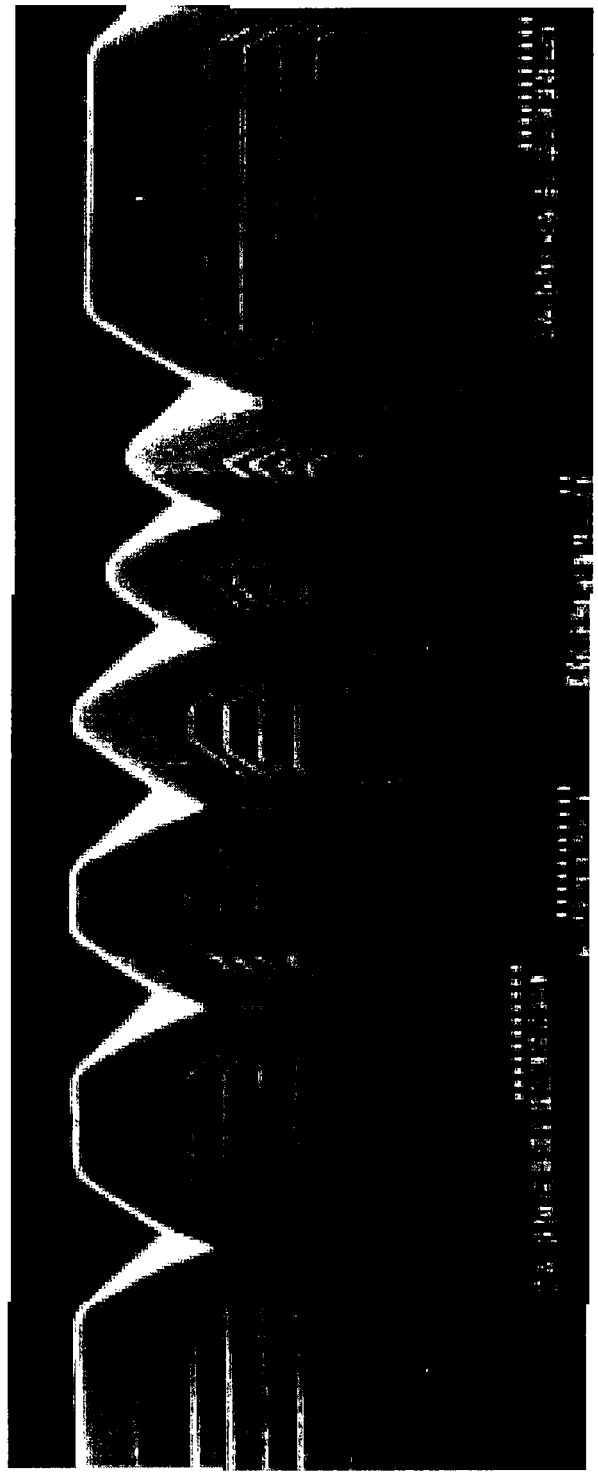
FIG. 21 is an SEM image of a semiconductor substrate with alternating $SiO_2$/SiN layers according to an embodiment of the present invention.
Figure 22:
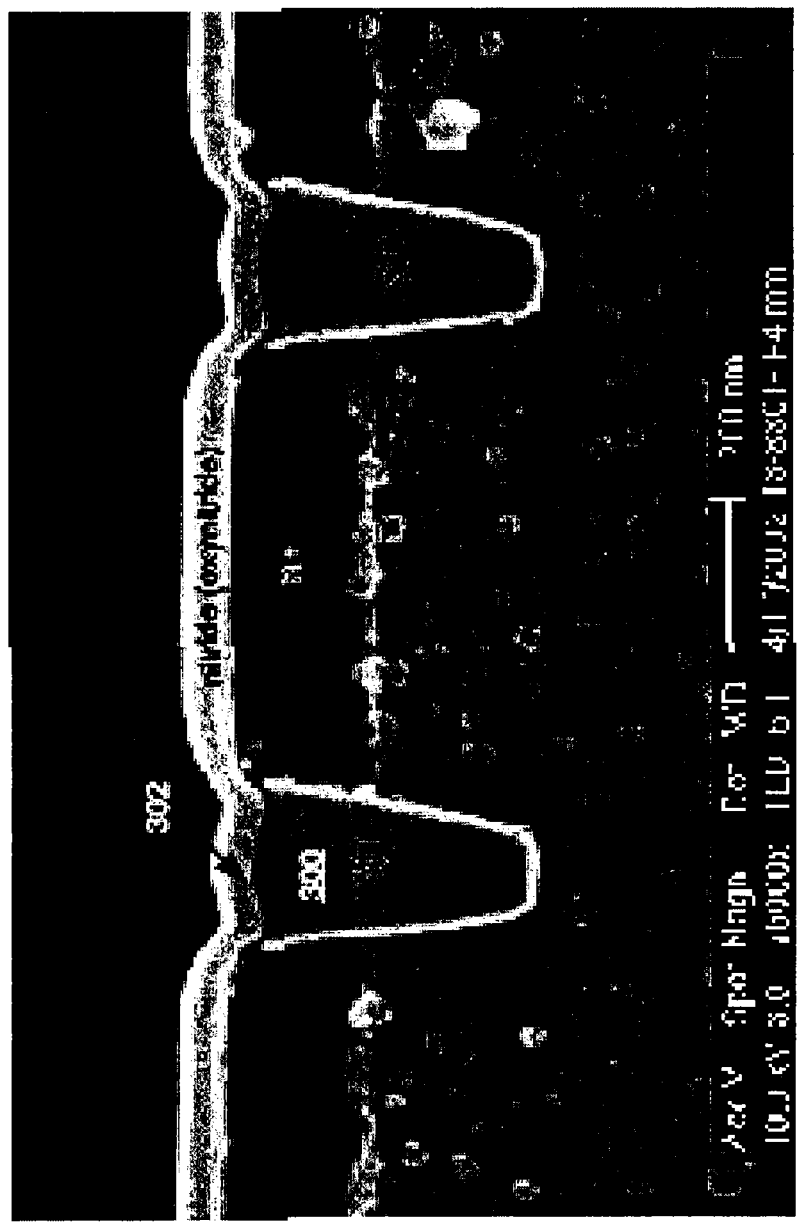
FIGS. 22-23 are SEM images of a semiconductor substrate using a STI process according to an embodiments of the present invention that do not show any micro-trenches.
Figure 23:
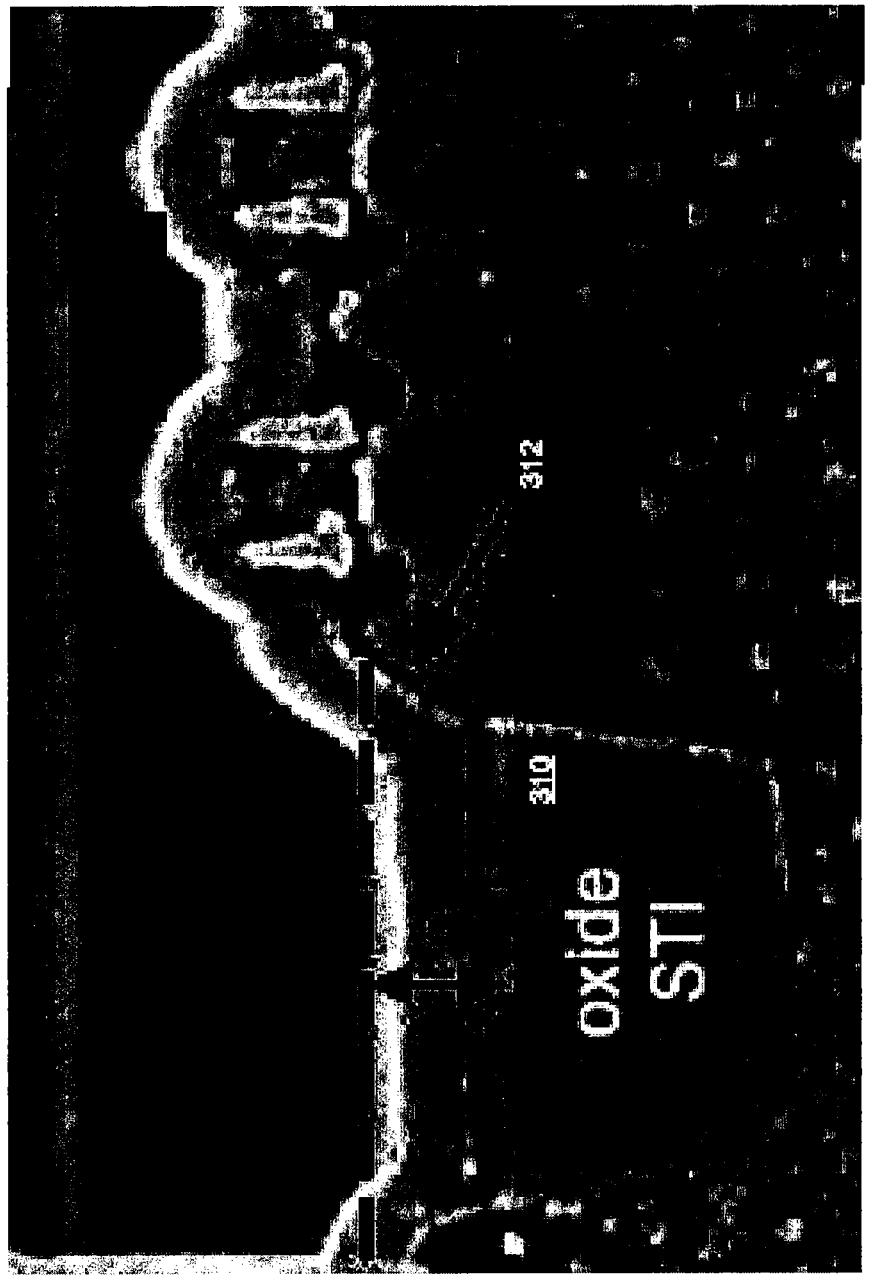

FIG. 21 is an SEM image of a semiconductor substrate with alternating $SiO_2$/SiN layers according to an embodiment of the present invention. The alternating layers of HDP oxide and silicon nitride can be seen filling the trench and also extending over mesa regions adjacent to the trench. FIGS. 22-23 are SEM images of a semiconductor substrate using a STI process according to an embodiments of the present invention that do not show any micro-trenches. For example, STI region 300 is capped off by an oxynitride layer 302 that occupies a top portion of the trench. The presence of the oxynitride layer 302 at the top of the trench prevents micro-trenches from forming during the ONO spacer etch step. FIG. 23 also shows a dual-material STI region made of HDP oxide 310 and silicon nitride 312 which is adjacent to active regions of the device. The thickness of the nitride layer is sufficient to prevent micro-trenches and voids from forming in subsequent process steps. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor structure comprising:
a semiconductor substrate with an even surface region;
a trench extending from the surface region into the semiconductor substrate, the trench having sidewalls, a height, and a bottom;
a shallow trench isolation structure filling the trench, the shallow trench isolation structure comprising a top surface coplanar with the even surface of the semiconductor substrate;
a silicon nitride layer entirely covering the top surface; and
a high-density plasma oxide layer disposed below the silicon nitride layer and having a thickness in a range between 65% and 80% of the height of the trench.

2. The semiconductor structure of claim 1, wherein the shallow trench isolation structure further comprises a trench liner overlying the bottom and the sidewalls of the trench.

3. The semiconductor structure of claim 2, wherein the trench liner is formed from a silicon oxide material.

4. The semiconductor structure of claim 2, wherein the trench liner is formed from a silicon nitride material.

5. The semiconductor structure of claim 1, wherein the silicon nitride layer is substantially coplanar with an even surface of the semiconductor substrate.

6. The semiconductor structure of claim 1, wherein the trench is substantially free of voids.

7. A semiconductor structure comprising:
a semiconductor substrate with a planar surface region free of an oxide layer;
a trench extending from the planar surface region into the semiconductor substrate, the trench having sidewalls and a bottom; and
a shallow trench isolation structure filling the trench and being formed from alternating layers of silicon nitride and high-density plasma (HDP) oxide, wherein the topmost layer of the shallow trench isolation structure is a silicon nitride layer and the bottom layer of the shallow trench isolation structure is a silicon nitride layer.

8. The semiconductor structure of claim 7, wherein bottom layer comprises a thickness ranging from 50 Angstroms to 1000 Angstroms.

9. The semiconductor structure of claim 8, wherein each of the silicon nitride layers other than the bottom layer comprises a thickness ranging from 50 Angstroms to 2000 Angstroms.

10. The semiconductor structure of claim 7, wherein the shallow trench isolation structure further comprises a trench liner overlying the bottom and the sidewalls of the trench.

11. The semiconductor structure of claim 10, wherein the trench liner is formed from a silicon oxide material.

12. The semiconductor structure of claim 10, wherein the trench liner is formed from a silicon nitride material.

13. The semiconductor structure of claim 10, wherein the bottom layer is directly formed on the trench liner.

14. The semiconductor structure of claim 1, wherein the shallow trench isolation structure is formed adjacent to an active region.

15. The semiconductor structure of claim 1, wherein the shallow trench isolation structure is formed adjacent to a transistor.

* * * * *